(12) United States Patent
Vardeny et al.

(10) Patent No.: US 6,943,359 B2
(45) Date of Patent: Sep. 13, 2005

(54) STRUCTURED ORGANIC MATERIALS AND DEVICES USING LOW-ENERGY PARTICLE BEAMS

(75) Inventors: Z. Valy Vardeny, Salt Lake City, UT (US); Sergey Li, Salt Lake City, UT (US); Matthew C. Delong, Salt Lake City, UT (US); Xiaomei Jiang, Salt Lake City, UT (US)

(73) Assignee: University of Utah, Salt Lake City, UT (US)

( * ) Notice: Subject to any disclaimer, the term of this patent is extended or adjusted under 35 U.S.C. 154(b) by 0 days.

(21) Appl. No.: 10/471,356

(22) PCT Filed: Mar. 13, 2002

(86) PCT No.: PCT/US02/07453

§ 371 (c)(1),
(2), (4) Date: Feb. 5, 2004

(87) PCT Pub. No.: WO02/073313

PCT Pub. Date: Sep. 19, 2002

(65) Prior Publication Data

US 2004/0113098 A1 Jun. 17, 2004

Related U.S. Application Data

(60) Provisional application No. 60/275,428, filed on Mar. 13, 2001.

(51) Int. Cl.$^7$ .............................................. H01J 37/30
(52) U.S. Cl. ................................. 250/492.2; 250/398
(58) Field of Search .......................... 250/492.2, 398; 430/312, 313, 314

(56) References Cited

U.S. PATENT DOCUMENTS

| | | |
|---|---|---|
| 5,831,272 A | 11/1998 | Utsumi .................... 250/492.2 |
| 5,942,374 A | 8/1999 | Smayling .................... 430/312 |
| 6,166,820 A | 12/2000 | Ghosh et al. ............... 356/508 |
| 6,576,093 B1 * | 6/2003 | Burroughes et al. ..... 204/192.1 |

* cited by examiner

Primary Examiner—Kiet T. Nguyen
(74) Attorney, Agent, or Firm—Gifford, Krass, Groh, Sprinkle, Anderson & Citkowski, PC

(57) ABSTRACT

Organic materials exposed to an electron beam for patterning a substrate (1) to make an optoelectronic organic device which includes a source, a drain, gate dielectric layer (4), and a substrate for emitting light.

23 Claims, 9 Drawing Sheets a)

b)

A

B

C

D a)

b)

STRUCTURED ORGANIC MATERIALS AND DEVICES USING LOW-ENERGY PARTICLE BEAMS

This application is a 371 of PCT/US02/07453 filed Mar. 13, 2002, which claims benefit of Ser. No. 60/275,428 filed Mar. 13, 2001.

This invention was made with Government support under Contract No. DEFG0393ER45490 awarded by the Department of Energy. The Government has certain rights to this invention.

FIELD OF THE INVENTION

This invention relates generally to the fabrication of electronic, optoelectronic, and photonic devices and, in particular, to the patterning of organic materials through direct exposure by an electron beam or other relatively low-energy source.

BACKGROUND OF THE INVENTION

Organic molecular crystals have emerged as promising new materials for optoelectronic and integrated-circuit devices. Large-scale integrated circuits based on organic transistors have already been demonstrated, as described in B. Crone et al., Nature 403, 521–523 (2000). On Feb. 17, 2001 Sony announced the development of the world's largest (13") full-color active matrix thin film transistor (TFT) organic electroluminescent display. In a series of publications in the journal *Science*, a team from Bell Labs (Lucent Technology) has shown that organic molecular crystals can be used in a number of high efficiency devices. For example, ambipolar field-effect transistors and inverters have been fabricated on organic molecular crystals, as described in J. H. Schön, S. Berg, Ch. Kloc, and B. Batlogg, Ambipolar Pentacene Field-Effect Transistors and Inverters," *Science* 287, 1022–1023 (2000).

Optoelectronic devices such as light-emitting field-effect transistors and an organic solid-state injection laser have also been demonstrated, as described in J. H. Schön, A. Dodabalapur, Ch. Kloc, and B. Batlogg, "A Light-Emitting Field-Effect Transistor," *Science* 290, 963–965 (2000), and J. H. Schön, Ch. Kloc, A. Dodabalapur, and B. Batlogg, "An Organic Solid State Injection Laser," *Science* 289, 599–601 (2000), respectively. Moreover, superconducting field-effect switches can be fabricated on molecular crystals, as described in J. H. Schön, Ch. Kloc, R. C. Haddon, and B. Batlogg, "A Superconducting Field-Effect Switch," *Science* 288, 656–658 (2000). The fabrication of all these devices has clearly demonstrated the great potential of organic molecular crystals for various types of integrated-circuit devices.

Currently, electronic and optoelectronic circuits are fabricated from conventional inorganic semiconductors using photolithography. High-energy electron beam lithography is used for the fabrication of the photolithographic masks. These methods incorporate spin-coating of photo-sensitive resist onto a substrate, baking the photoresist coating, exposing a pattern on the photoresist, developing the photoresist (i.e. chemically removing either the exposed or unexposed areas), performing some operation on the underlying semiconductor (e.g. doping or oxidizing) and, finally, removing the remaining resist.

Every such procedure can have a detrimental effect on device properties when an organic molecular crystal is the substrate or active layer. Organic molecular crystals are very fragile, presenting serious difficulties in processing by such conventional wet chemical lithographic methods. Up to now, either a simple low-resolution shadow-mask technology has been used for fabrication of organic devices, or all photolithography procedures for patterning of electrodes and dielectric layers are done before the active organic layer is deposited.

A conventional electron-beam lithography method, for example, may include the following steps: 1) an electron-beam sensitive polymer layer (the resist layer) is spin-coated onto a semiconductor substrate; 2) the resist layer is patterned by exposure to the electron beam, during which step the polymer chains are broken in exposed areas (for positive resist) and become soluble; and then 3) the exposed polymer layer is developed by removal of soluble exposed areas. The semiconductor material is then subsequently patterned using different etching methods (such as wet chemical etching or dry plasma etching) using the developed patterned resist layer as a mask.

Low-energy electron-beam lithography (LE-EBL) was proposed by R. F. W. Pease and co-workers (Y. W. Yau, R. F. W. Pease, A. A. Iramnanesh and K. J. Polasko, *J Proc. Sci. Technol* 19, 1048 (1981)), and its capabilities have been demonstrated in a number of publications, such as: Y.-H. Lee, R. Browning, N. Maluf, G. Owen, and R. F. W. Pease, "Low voltage alternative for electron-beam lithography," *J. Vac. Sci. Technol.* B 10(6), 3094 (1992); P. A. Peterson, Z. J. Radzimski; S. A. Schwalm, and P. E. Russell, "Low-voltage electron beam lithography," *J. Vac. Sci. Technol.* B 10(6), 3088 (1992); and T. H. P. Chang, M. G. R. Thomson, M. L. Yu, E. Kratchmer, H. S. Kim, K. Y. Lee, S. S. Rishton, and S. Zolgharnain, "Electron beam technology—SEM to micro column," *Microelectronic Engineering* 32, 113 (1996).

Although LE-EBL is a promising method to reduce proximity effects in patterns with sub-micron resolution while avoiding the complicated correction algorithms used in high-energy electron-beam lithography, there is no suggestion in these references that the electron beam itself can be used to effect the removal of material from an organic molecular film. Rather, according to conventional methods, removal of material is achieved in a second etching step, with the associated problems of resolution control, contamination, and the like.

SUMMARY OF THE INVENTION

This invention improves upon existing methods by providing a method of writing patterns onto organic molecular crystalline thin films with high resolution for the fabrication of diverse optoelectronic devices and integrated circuits.

In the preferred embodiment, pre-designed patterns are inscribed into organic molecular crystals by thermal evaporation resulting from local heating by a beam of electrons, preferably having energies of less than 6 keV. Higher electron energies may be used, e.g., for increased processing speed or patterning of multiple, stacked layers, through problems with proximity effects may increase.

The present method can be performed within a scanning electron microscope (SEM), or using conventional electron beam systems which provide the necessary control of beam position. According to the invention, a pattern can be formed in a layer by exposure of multiple regions of the layer using the same beam, or by exposure to multiple beams, or some combination of these approaches. Other electron sources may be used in alternative embodiments including multiple electron beams and/or ion beams.

The advantages of direct patterning by a low-energy electron beam according to the invention include at least the following:

- low penetration depth of low energy electrons;
- reduced proximity effect;
- no need for spin-coating of a thin electron-beam-sensitive resist layer and chemical etching as in conventional electron beam lithography (EBL); and
- no danger of chemical attack of the active layer by the resist or solvents.

A further advantage of the invention is the ability to pattern one organic material on top of another. Due to the low penetration depth (<0.5 micron) of the low-energy electron beam utilized, the patterning is carried out through the sequential removal of only the exposed top organic material, layer by layer. In addition, because patterning is carried out by thermal evaporation of organic material during the electron-beam writing, the patterning process is greatly simplified in comparison with conventional electron-beam lithography, which is functionally equivalent to photolithography.

Through the use of the invention, the myriad steps of conventional photolithographic processing are essentially combined into a single step, since patterning is carried out directly on the organic material without the use of an electron resist polymer layer. Since the material exposed to the electron beam is removed by local heating and thermal evaporation, the patterning process is greatly simplified by avoiding the use of electron-beam sensitive resists and chemical etching.

The direct electron-beam-induced patterning according to the invention is also simpler, cleaner, and higher in resolution than conventional methods. The application of the method to the fabrication of optoelectronic organic devices allows higher resolution than conventional electron-beam lithography methods, in which a resist layer is used. The high resolution allows applications to the patterning of recently invented optical and optoelectronic devices such as light-emitting organic transistors and solid-state organic lasers.

Resolutions of less than the wavelength of light are made possible by the invention, which are difficult to achieve using photolithographic methods. Conventional electron-beam lithography is often too expensive for device fabrication, in part because of the multiple steps involved in the conventional methods. By providing a simpler method of electron-beam patterning, the present invention makes high resolution achievable at a lower cost than conventional EBL methods.

In terms of particular applications, a method is disclosed for forming a structure in a layer of a molecular material. A region of the layer is exposed to a particle beam, such as an electron beam or ion beam, so that a quantity of the molecular material is removed by thermal evaporation. The structure may be a hole, line, or cavity, or may form part of a pattern, photonic structure, grating, Bragg mirror, waveguide, laser, light-emitting diode, transistor, or other electronic, optical, photonic, or optoelectronic device.

DETAILED DESCRIPTION OF THE INVENTION

Fabrication of micron- and sub-micron-sized structures on and within organic molecular crystals is carried out by direct writing of various patterns using an electron beam. The process is based on local heating and thermal evaporation of organic molecular material by a focused electron beam of low energy (<6 keV) from a scanning electron microscope. Many organic materials have low melting and sublimation temperatures, as shown in Table 1 below:

TABLE I

| Name of Compound | Melting Point °C. | Sublamination Temperature in Vacuum | Heat of Sublamination, kJ/mole |
| --- | --- | --- | --- |
| Naphthyalene | 80.55 | | 72.99 |
| Anthracene | 216–220 | | 101.8 |
| Tetracene | ~357 | 140–160 | 124.9 |
| Pentacene | >300 | 220–240 | 125.7 |
| Perylene | 278–280 | | |
| Pyrene | 149–151 | | |

Figure 1:
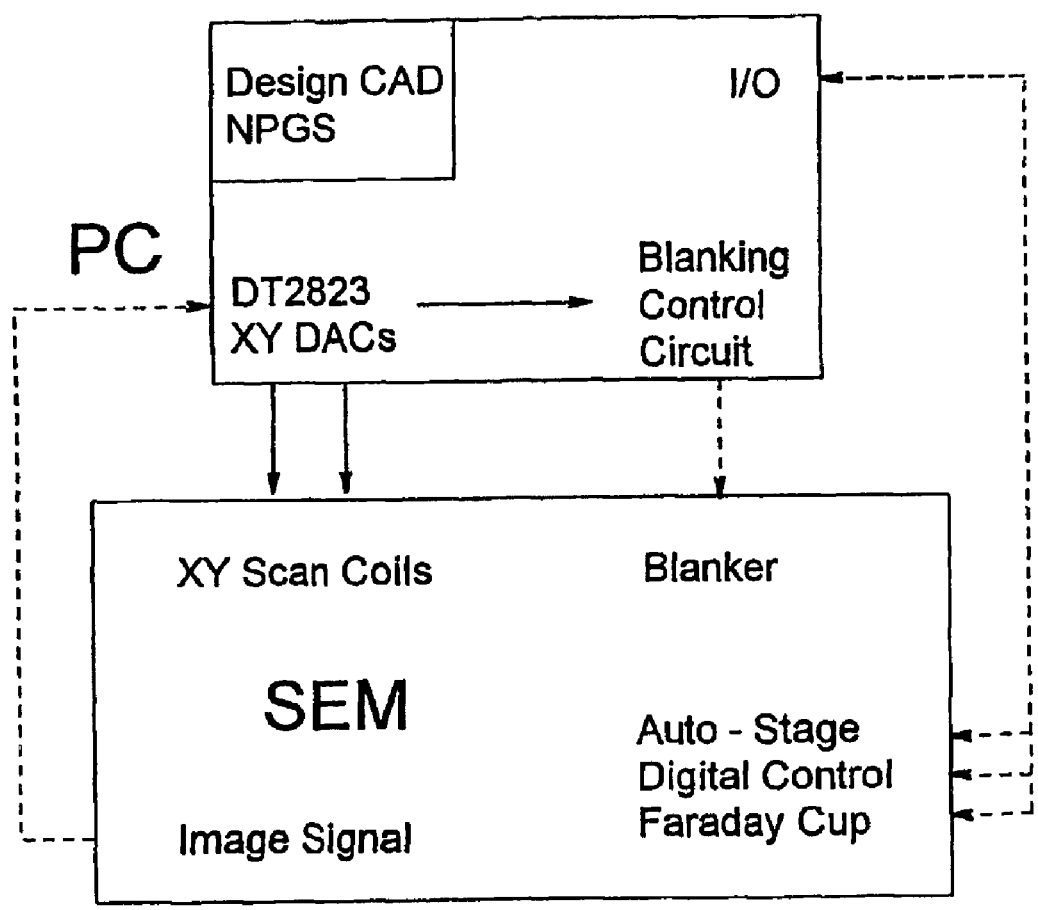
FIG. 1 is a schematic of a scanning electron microscope applicable to the present invention.

In our experiments, we used a commercial scanning electron microscope, LEO S440, equipped with a nanometer pattern generation system (NPGS, JC Nabity Lithography Systems), as shown in FIG. 1. The NPGS system writes a pattern by simultaneously controlling the x-y scan coils and beam blanking of the microscope. Patterns are designed by DESIGN CAD software and written directly on and within organic molecular crystal as a series of point exposures by vector scanning of a low-energy electron beam. Because the electron beam is highly focused by the electron optics of a scanning electron microscope (the electron-beam diameter is <100 nm), the method allows fabrication of different micron and sub-micron photonic and electronic structures such as 2-D photonic crystals as well as photodiode and light-emitting device arrays.

Vector-based systems are typically more efficient than raster systems since the electron beam touches only those surface areas of the resist that are to be exposed. However, in practical implementations a dedicated a-beam writing machine incorporating a highly effective projection electron or ion beam lithography system is preferred. An efficient LE-EBL system with high-throughput and sufficient accuracy for mass production of integrated circuit devices with sub-micron features has been proposed, for example as described in Utsumi Takao, (low-energy electron beam lithography," U.S. Pat. No. 5,831,272, incorporated herein by referenced. Such a system can be used for the commercial mass production of organic devices by the present method. Moreover, because the penetration depth of low-energy electron beam is small (for electron energy of about 1 kev the penetration depth is of the order 100 nm) the proximity effect is also small.

A unique feature of the invention involves the novel method of patterning. Conventional electron-beam lithography is complicated consists of multiple sequential procedures. As discussed above, first an electron-beam sensitive resist layer is spin-coated onto semiconductor substrate. The second step is patterning of the electron-beam sensitive resist layer by the exposure to the electron beam. The next step is the development of the exposed layer. Only after this step is complete can the patterning of semiconductor material be carried out by different etching methods using the patterned resist layer as a mask.

In the present invention, all these steps are combined into one procedure because patterning is carried out directly onto the organic material without a resist, and the unnecessary organic material is simultaneously removed by local thermal evaporation during electron beam writing. Therefore the patterning process is greatly simplified by avoiding usage of electron-beam sensitive resists and chemical etching of organic material.

EXAMPLES

Example 1

Patterning of Undoped and Doped Organic Molecular Crystals

Figure 2:
FIGS. 2A through 2D show the patterning of an organic molecular crystal by low-energy electron beam lithography according to the invention.
Figure 2:
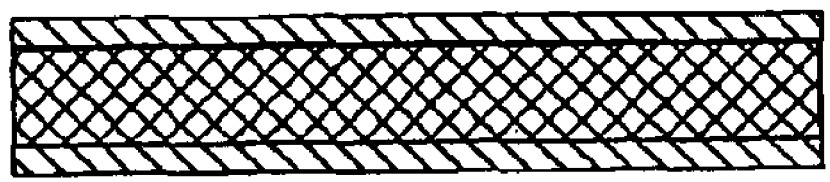
Figure 2:
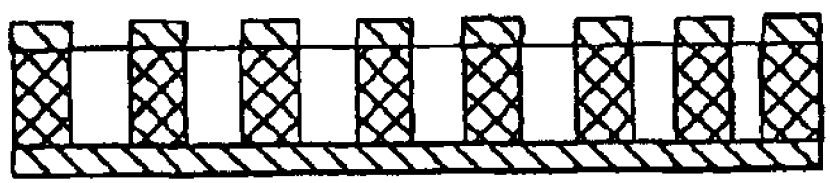
Figure 2:
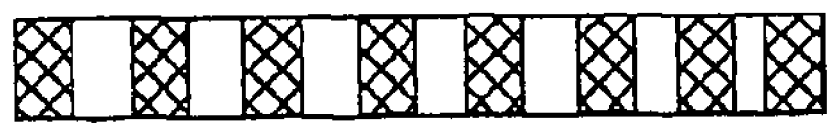

FIGS. 2A through 2D illustrate the principle of patterning undoped organic molecular crystalline or semi-crystalling material in accordance with the invention. In FIG. 2A, an organic molecular crystal thin film having a preferred thickness in the range of 0.5–20 $\mu$m is grown by physical vapor deposition. However, because the low-energy election beam with low penetration depth is used for patterning in the present invention, the method can also be applied to patterning of organic thin films grown on various substrates by vacuum thermal evaporation or by other epitaxial methods.

In FIG. 2B, the film is coated with a much thinner conducting layer of gold or aluminum by conventional sputtering or thermal deposition for the purpose of avoiding charging of the molecular crystal during patterning by the electron beam. The conducting layer is preferably on the order of $\leq$10 nm thick. Note that in the case of doped molecular crystals, which are conducting, the charging elect is absent and there may be no need for an additional conducting layer. In FIG. 2C, a pattern is formed in the organic layer using a low-energy particle beam according to the invention. This is followed by the removal of the conducting layer, as necessary, by conventional etching methods. The result in FIG. 2D is a patterned organic molecular crystal.

Figure 3:
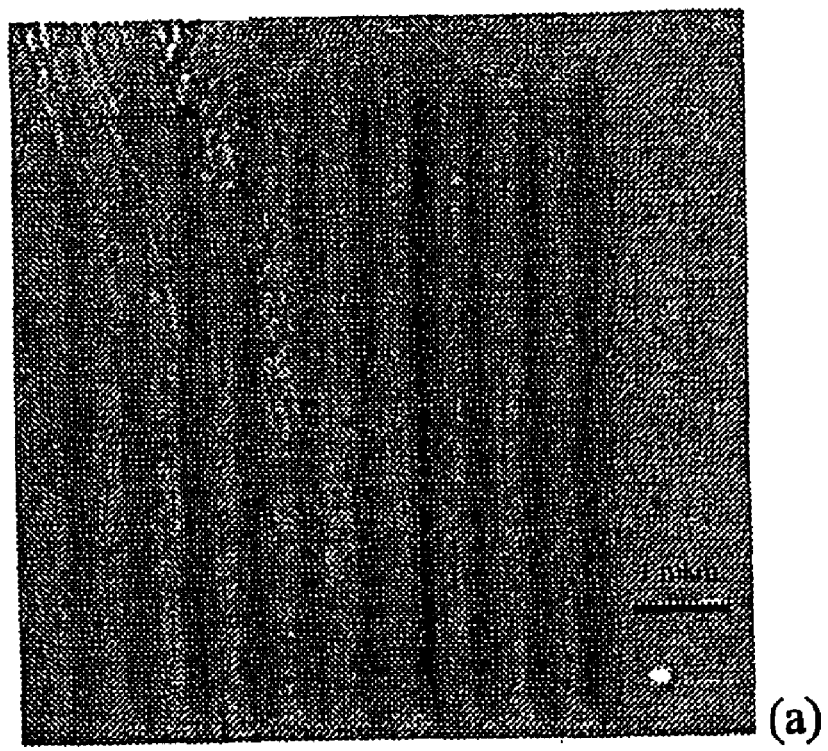
FIG. 3A shows a grating fabricated on the organic molecular crystal tetracene.
FIG. 3B shows a two-dimensional photonic crystal fabricated on the organic molecular crystal tetracene according to the invention.
Figure 3:
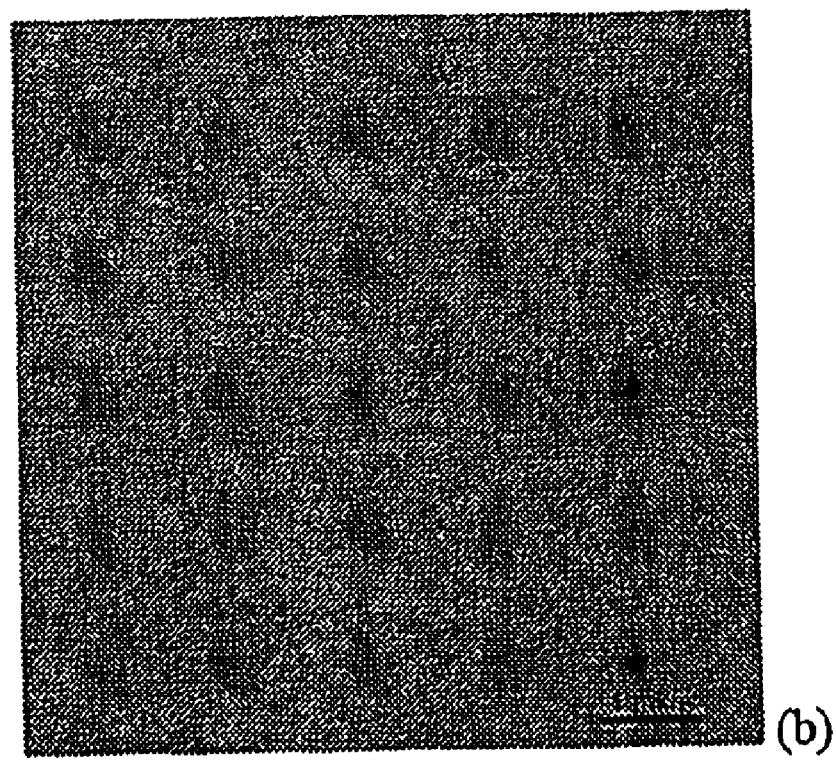

FIG. 3A shows a grating, and FIG. 3B shows a two-dimensional photonic crystal, both fabricated on the organic molecular crystal tetracene according to embodiments of the present invention. The line width and period of the grating are 200 nm, and the diameter of the holes in FIG. 3B also about 200 nm.

Example 2

Figure 4:
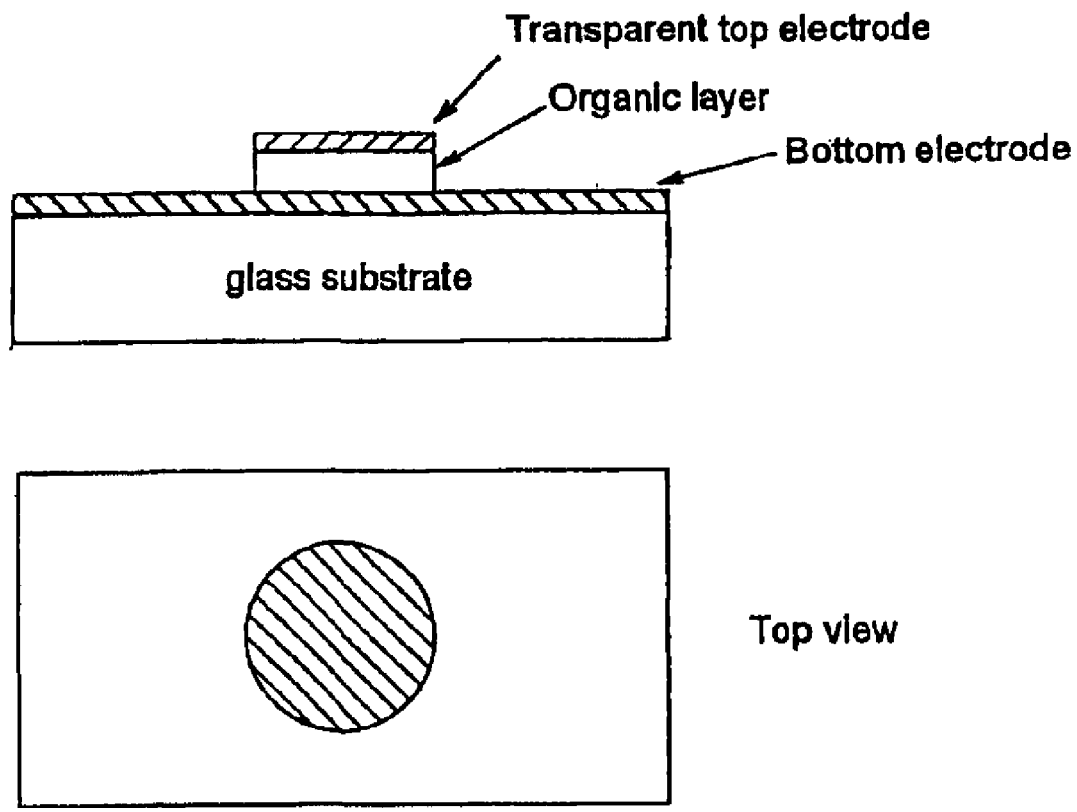
FIG. 4 shows side and top views of a microdisk laser fabricated according to the invention.

Application of the Invention for Fabrication of Organic Lasers Microdisk and Microring Lasers Small diameter microdisks and microrings having feature sizes on the order of one micrometer are needed to fabricate a single-mode whispering-gallery-mode organic laser. FIG. 4 illustrates how such organic microstructure devices can be prepared according to the invention. An organic layer (e.g. anthracene, or tetracene) is deposited onto a gold bottom electrode layer previously deposited onto a substrate (for example, glass, Si or polymer). The microdisk (~1 $\mu$m) is formed in the organic layer according to the invention, i.e. by evaporating the organic material from around the ring. The top electrode (ITO or Al-doped ZnO) is then deposited onto the microdisk through a shadow mask, which protects other areas of the device.

Organic Distributed Bragg Reflector (DBR) Lasers

Figure 5:
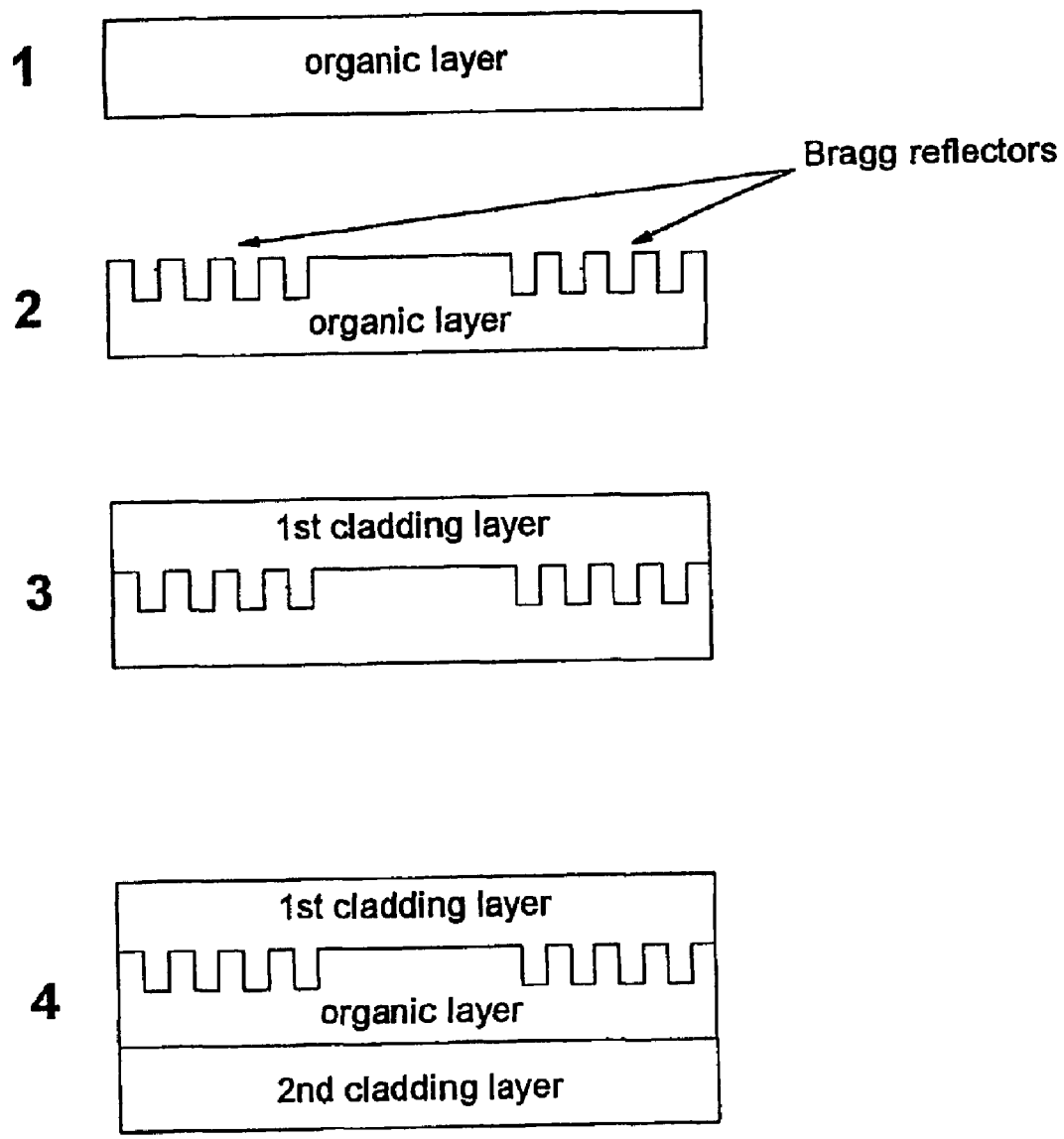
FIG. 5 shows four important processing steps associated with the fabrication of a DBR organic laser.

A distributed Bragg reflector (DBR) laser structure comprises an optical waveguide taking the form of a first and a second cladding region with a core organic lasing region in between. The core organic layer contains two Bragg reflectors which may be fabricated according to the invention. FIG. 5 schematically demonstrates the process, as follows:

1. An organic molecular crystal (for example, iodine-doped anthracene of thickness about 1 $\mu$m) is grown by physical vapor deposition or other suitable process.

2. Two Bragg reflectors are formed according to the invention.

3. The first cladding layer, with refractive index smaller than that of the organic molecular crystal (~1.8), is deposited on the patterned organic molecular crystal.

4. A second cladding layer is deposited on the other side of device.

The wavelength of laser is determined by $\lambda=d2n_{eff}$, where d is the grating period, and $n_{eff}$ is the elective refractive index. Therefore, for a shorter laser wavelength, a smaller grating period is used. For example, for a violet organic laser with emission wavelength about 400 nm, the period of the grating should be about 100 nm. While such a grating can be made according to the present invention, it is not possible to do so using conventional phototithographic techniques.

Photonic Bandgap Laser Structures

Figure 6:
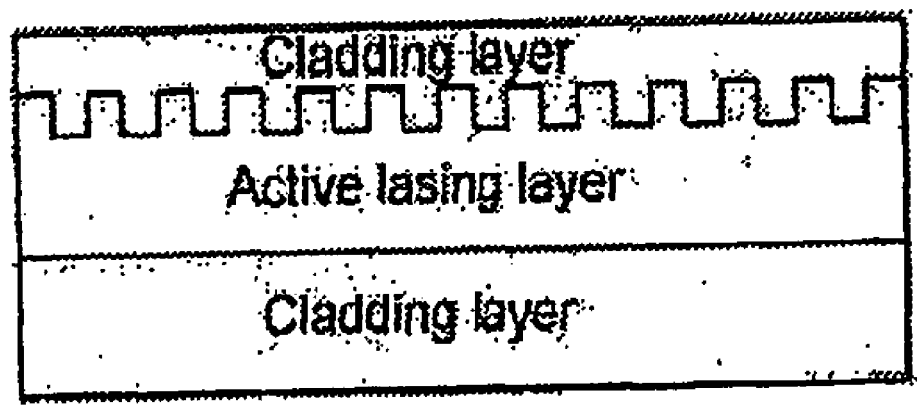
FIG. 6A is a schematic depiction of a photonic bandgap laser structure.
FIG. 6B is a top-down view of the active lasing layer of the device of FIG. 6A.
Figure 6:
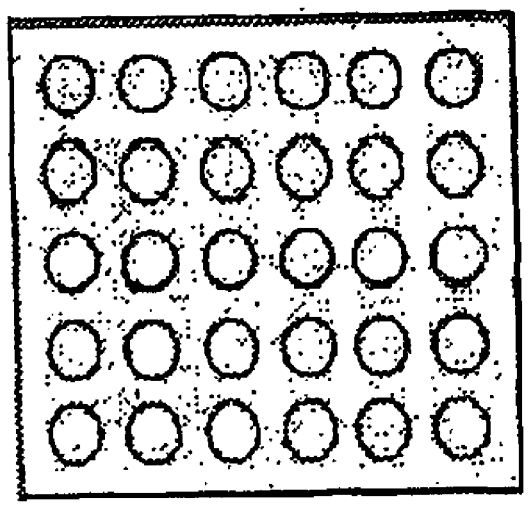

FIG. 6a is a schematic depiction of a photonic bandgap laser structure fabricated according to the invention. FIG. 6b shows a top view of the active lasing layer. The diameter of the holes in the organic material is in the range of 50–100 nm with spacing 100–500 nm.

Example 4

Organic Field-Effect Transistor with Imbedded 2D Photonic Crystal

Figure 7:
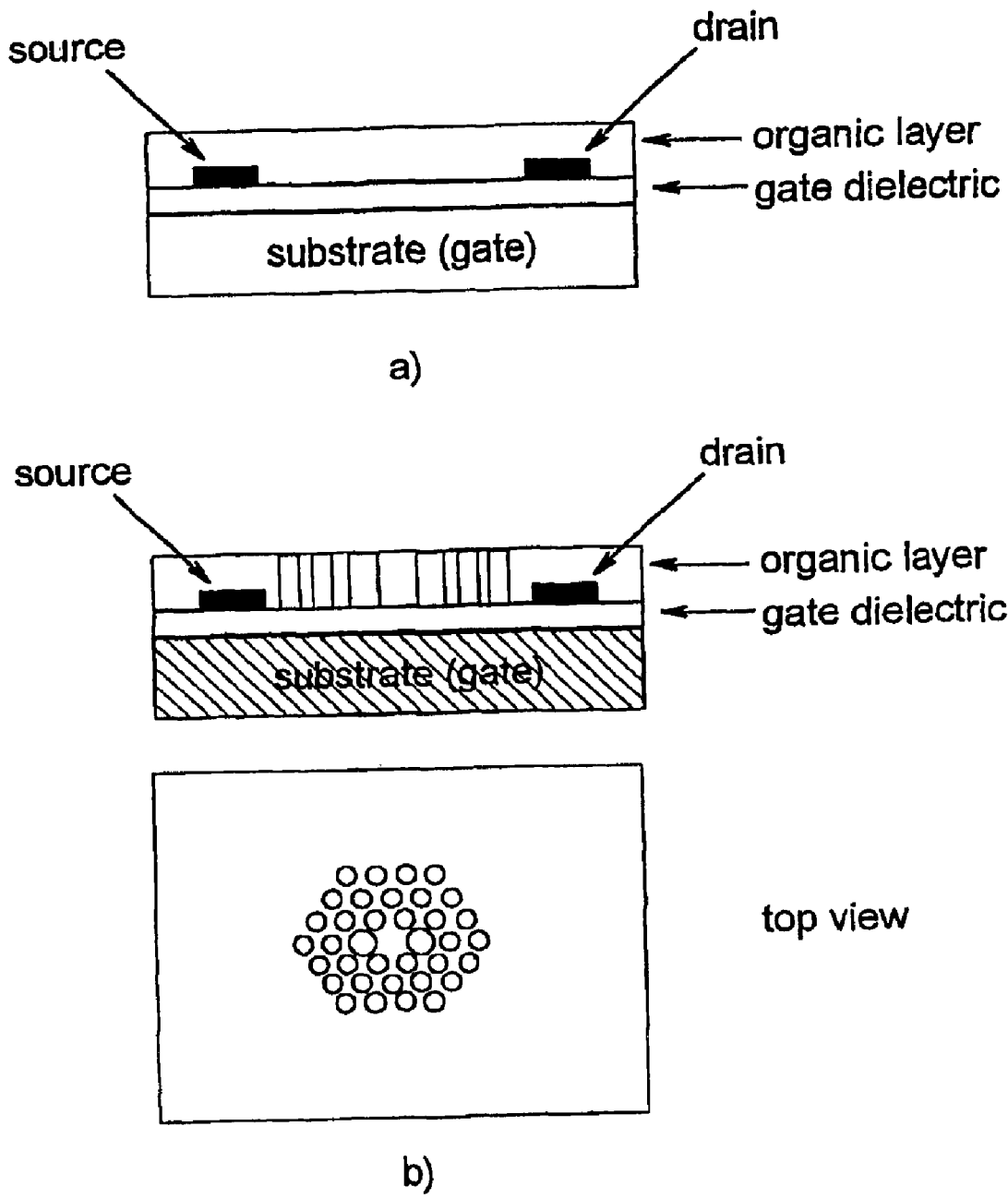
FIG. 7A shows the fabrication of an organic field-effect transistor with imbedded two-dimensional photonic crystal.
FIG. 7B is a top-down view of the device of FIG. 7A.

Light-emitting, organic field-effect transistors are known in the art. Such a device may be improved through the invention by imbedding a two-dimensional photonic crystal with defects inside the structure. The efficiency of the laser structure with a two-dimensional photonic band-gap defect has already been demonstrated by 0. Painter et al., *Science* 284, 1819–1821 (1999). A light-emitting organic field elect transistor is fabricated by conventional technology (FIG. 7a). The thickness of the active area of structure should be half wavelength (225–350 nm). A 2D photonic crystal is then fabricated in the active area between the source and drain electrodes according to the invention.

The diameter of the holes in the photonic crystal structure for operation in the visible spectral range should be of the order of 100 nm, which is achievable only by high-resolution lithography methods, as described in the present invention.

Example 5

Photonic Crystal Waveguides

Figure 8A:
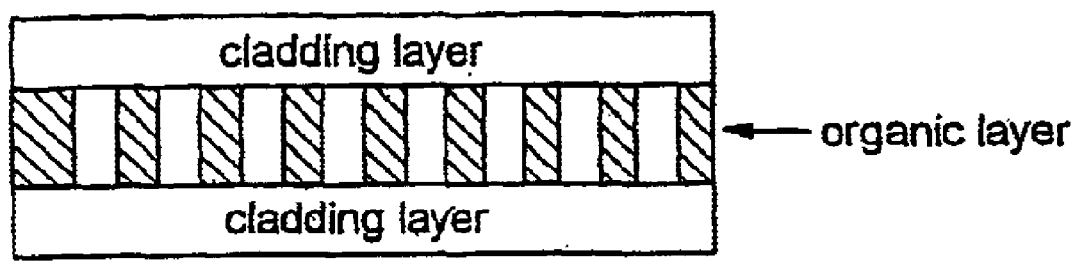
FIG. 8A is an example of a photonic crystal waveguide formed in an organic molecular crystal.
Figure 8B:
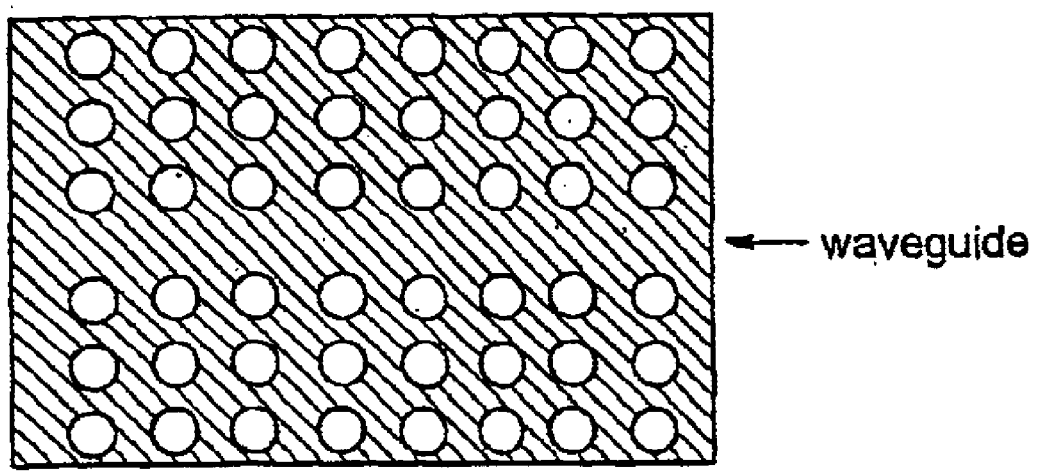
FIG. 8B is a top-down view of the device of FIG. 8A.
Figure 9:
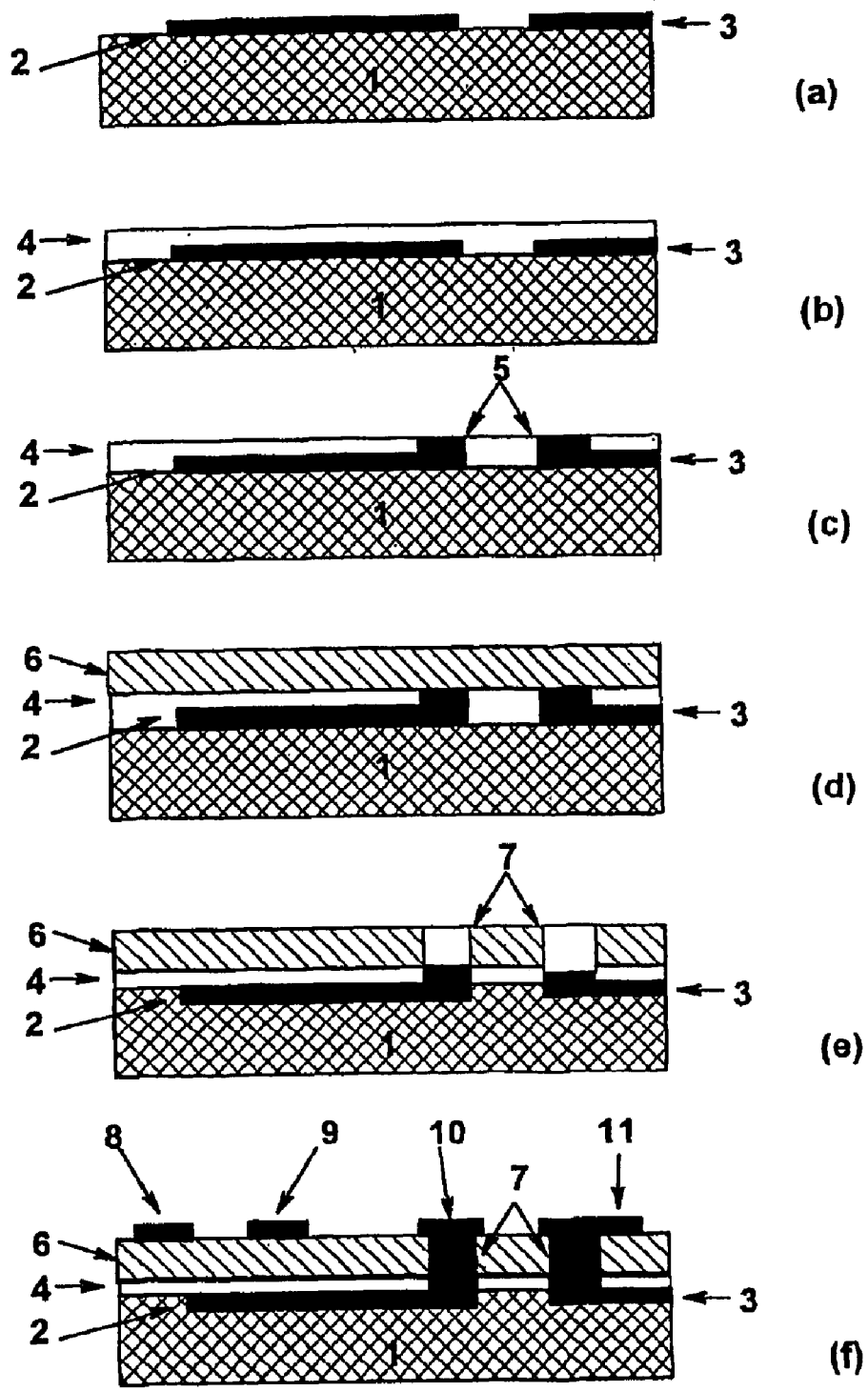
FIGS. 9A through 9F show a method of fabrication of vias according to the inventions for organic transistor integrated circuits.

FIGS. 8A and 8B illustrate an example of a photonic crystal waveguide formed in an organic molecular crystal. Light is confined in organic layer in vertical direction by two cladding layers and by photonic crystal structure in horizontal direction. The present invention is capable of fabricating this type of optical waveguide in the blue and violet spectral range, which is not possible with conventional optical lithography. Such a photonic crystal waveguide can also be incorporated into an optoelectronic circuit.

Example 6

Organic Integrated Circuits

A significant advantage of organic integrated circuits is the possibility of fabrication on inexpensive glass or flexible plastic substrates. To date, however, there have been serious problems in fabricating such circuits because a technique is required for making organic layers into vertical electrical interconnects or "vias" i.e. to electrically connect top and bottom electrodes.

The present invention offers a method of fabricating such vias. The method of fabrication of vias for transistor structures as the elementary units for integrated circuits is shown in FIGS. 9A–9F. In (a), the bottom gate electrode 2 and an additional bottom electrode 3 are formed on a glass or plastic substrate 1 by conventional photolithography. A dielectric layer, 4, ($Al_2O_3$ or a polymer such as PMMA) is then deposited on top of the electrodes, (b). Vias 5 are formed in the dielectric layer (c), again using conventional photolithographic techniques if the dielectric is $Al_2O_3$. The techniques of this invention are preferably used if the dielectric layer is a polymer such as PMAA.

Organic layer 6 is deposited or physically-vapor grown on dielectric layer (d). The active organic layer is then patterned (e) according to the present invention to form holes for the vias 7. The electronically active structures on and within this organic layer are also formed in this step. The integrated circuit is finally completed by depositing (sputtering or thermal evaporation can be used) the top electrodes such as a source 8 and drain 9. Vias to the bottom electrodes 7 and their external contacts (10,11) are also fabricated in step (f).

The result is an electrical connection through an organic layer achieved through the exposure of the layer to a low-energy particle beam. A void (or hole) is formed in the organic layer by the beam, and the subsequent filling of the void with a conducting material (such as metal) so that an electrical connection is formed through the organic layer. The electrical connection formed by this method is useful in creating integrated optoelectronic devices.

Example 7

Microdisplays

The present invention also find utility in the fabrication of organic microdisplays, including those currently manufactured by eMagin Corp. Microdisplays of this kind are of such high resolution that they are only practical when viewed with optics. The devices are used in small optically viewed devices such as video headsets, camcorders, viewfinders, and other portable devices. Possible applications of such devices are very broad: 1) entertainment systems, 2) night vision, 3) digital navigation, and 4) telecommunications. The present invention represents an improvement over the laser interferometric lithography method described in U.S. Pat. No. 6,166,820.

Other Embodiments

In addition to organic molecules such as polyacenes and their derivatives, other film materials may be patterned according to the invention, such as films formed from metal complexes, oligomers, monolayers, surfactants, biomolecules, surface-aligned molecules (such as Langmuir-Blodgett films), and the like. An array of electron emitters, such as a microelectrode array, may be used for patterning (for example) two-dimensional photonic structures. Materials may also be patterned using particle beams (electron, ion, other charged particle, atomic, sub-atomic, molecular), radiation beams, or some combination thereof. The beam may be used to remove a component from a composite film, such as a molecular dopant from a polymer film, a volatile component from a film, or a surface-bound species.

The film material remaining after patterning may be further processed, for example doped, irradiated, bombarded, thermally treated, chemically modified, and the like. The patterned films may be polymerized so as to form a polymer, such as a photonic polymer or a resist layer for other etching techniques. Patterned films may be used for other applications, such as alignment layers (e.g. for liquid crystals), surface functionalization, product identification, information content, memory applications, anti-counterfeit applications, and the like. Patterning may occur in a chemically reactive atmosphere, in which case material exposed by the patterning process van be chemically functionalized, reacted, etched, and the like, as the patterning progresses.

The techniques described herein can also be used for the surface patterning of molecular crystals and other materials that are not in film form. These surface patterns may, for example, be used in a variety of optical and optoelectronic devices. Pattered films may be crystalline, amorphous, or glassy. An organic molecular light-emitting device may comprise a film of active material for light emission (such as a polymer), adjacent to a film of a second material chosen for high-quality patterning. For example, a polymer light-emitting device may be combined with one or more photonic mirror formed from a patterned organic film. Organic films may be used in conjunction with conventional inorganic semiconductors, such as silicon, e.g. to provide photonic mirrors.

In addition to the devices described above, the invention may be used in the fabrication of photonic crystal lasers, conventional mirrored lasers, light-emitting diodes, photonic band gap diffractors, and waveguides. Molecular organic crystals may also be either semiconducting or superconducting. Semiconducting applications include field-effect transistors, diodes, and electronic and optoelectronic integrated circuits. Superconducting devices include Josephson junctions and Gunn transistors.

We claim:

1. A method of patterning a substrate, comprising the steps of:
   providing a layer of organic molecular material; and
   exposing the layer to a low-energy particle beam sufficient to remove a quantity of the material where the beam strikes the layer.

2. The method of claim 1, wherein the particle beam is an electron beam.

3. The method of claim 2, wherein the electron beam has an energy of less than 6 kiloelectron volts.

4. The method of claim 1, wherein the particle beam is an ion beam.

5. The method of claim 1, further including the step of exposing the layer with multiple low-energy particle beams.

6. The method of claim 1, wherein the organic molecular material is crystalline or semi-crystalline.

7. The method of claim 1, wherein the organic molecular material is a polyacene.

8. The method of claim 1, wherein the organic molecular material is provided in the form of a thin film.

9. The method of claim 1, wherein the particle beam penetrates a micron or less into the layer of organic molecular material.

10. The method of claim 1, wherein the removed organic molecular material is in the form of a hole, line or cavity.

11. The method of claim 1, wherein the removed organic molecular material forms part of an electronic, optoelectronic, or photonic device.

12. The method of claim 11, wherein the electronic, optoelectronic, or photonic device includes a diode, transistor, laser, waveguide, dispersive or diffractive structure.

13. The method of claim 1, wherein layer is doped or undoped.

14. The method of claim 1, further including the step of growing the layer of material using a vapor deposition, vacuum thermal evaporation, or epitaxial process.

15. The method of claim 1, further including the step of depositing a thin conductive coating on the layer prior to exposure.

16. The method of claim 15, wherein the thin conductive coating is composed of gold or aluminum.

17. The method of claim 15, wherein the thin conductive coating is applied through sputtering or thermal deposition.

18. The method of claim 15, wherein the thin conductive coating is 10 nanometers or less in thickness.

19. The method of claim 1, further including the step of bonding one or more electrically conductive electrodes to the layer of material.

20. The method of claim 19, including an electrode which is at least partially transparent.

21. The method of claim 1, further including the step of supporting the layer of material on a glass substrate.

22. The method of claim 1, further including the step of supporting the layer of material between first and second cladding layers.

23. The method of claim 1, further including the step of fabricating a via by depositing electrically conductive material where the layer of material has been removed.

* * * * *